(12) United States Patent
Ahn

(10) Patent No.: US 8,797,809 B2
(45) Date of Patent: Aug. 5, 2014

(54) NONVOLATILE MEMORY DEVICE

(75) Inventor: Sung-Hoon Ahn, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 259 days.

(21) Appl. No.: 13/337,213

(22) Filed: Dec. 26, 2011

(65) Prior Publication Data
US 2013/0094304 A1    Apr. 18, 2013

(30) Foreign Application Priority Data

Oct. 18, 2011    (KR) .......................... 10-2011-0106599

(51) Int. Cl.
*G11C 7/06* (2006.01)
(52) U.S. Cl.
USPC ............ 365/189.07; 365/185.12; 365/185.17; 365/185.18; 365/210.11
(58) Field of Classification Search
USPC ............. 365/189.07, 185.12, 185.17, 185.18, 365/210.11
See application file for complete search history.

(56) References Cited

U.S. PATENT DOCUMENTS

| 6,072,742 | A  | * | 6/2000 | Ooishi ......................... 365/226 |
| 7,532,514 | B2 | * | 5/2009 | Cernea et al. ............ 365/185.18 |
| 2002/0031032 | A1 | * | 3/2002 | Ooishi ......................... 365/226 |
| 2013/0021085 | A1 | * | 1/2013 | Kumar et al. ................. 327/333 |

FOREIGN PATENT DOCUMENTS

KR    1020050100285 A    10/2005

* cited by examiner

*Primary Examiner* — Toan Le
(74) *Attorney, Agent, or Firm* — William Park & Associates Patent Ltd.

(57) ABSTRACT

A nonvolatile memory device includes: a driving voltage generation unit configured to generate a driving voltage of a core bias line included in a memory cell current path; a comparison unit configured to compare a voltage level of the core bias line with a predetermined limit level in response to a virtual negative read signal; and a compensation driving unit configured to compensation-drive the core bias line in response to an output signal of the comparison unit.

18 Claims, 4 Drawing Sheets

NONVOLATILE MEMORY DEVICE

CROSS-REFERENCE TO RELATED APPLICATIONS

The present application claims priority to Korean Patent Application No. 10-2011-0106599, filed on Oct. 18, 2011, which is incorporated herein by reference in its entirety.

BACKGROUND

1. Field of the Invention

Embodiments of the present invention relate to a semiconductor design technology, and more particularly, to a core bias line stabilization circuit of a nonvolatile memory device.

2. Description of the Related Art

A semiconductor integrated circuit (IC) is provided with an internal driving voltage generation block for stably operating various internal logics and devices. In the case of a nonvolatile memory device, in particular, a NAND flash memory, biases with very various levels are needed.

A NAND flash memory performs program and read operations using a distribution of a cell threshold voltage (Vth). Although it is advantageous if the distribution of the cell threshold voltage (Vth) is narrow, as semiconductor devices shrink circuit line widths also shrink, which may cause the distribution of the cell threshold voltage (Vth) to widen.

As the distribution of the cell threshold voltage (Vth) is widened, a read operation in a negative region has been introduced. In order to read a negative region, a voltage difference between a selected word line and a source line corresponding to a source of a cell string should be negative. That is to say, the voltage of the selected word line should be lower than the source line.

There are two schemes for realizing negative read. One scheme is to apply 0V to the source line and a negative bias to the selected word line, and the other scheme is to apply 0V to the selected word line and a positive bias (VCORE) to the source line and a virtual power line. The latter is called a virtual negative read scheme.

Advantages of the virtual negative read scheme are that a negative bias is not needed and the separation of the well of the path transistor of a row decoder is not required. On the other hand, disadvantages are caused in that noise generation is substantial when applying the specified positive bias (VCORE) to the source line and the virtual power line. Such noise generation leads to a distortion of the cell threshold voltage (Vth), thereby deteriorating characteristics of a device.

FIG. 1 is a view showing cell current flow in a virtual negative read operation and the configuration of a switch circuit.

First, the configuration of the switch circuit shown in FIG. 1 will be described.

An NMOS transistor M1 receives a page buffer enable signal PBSENSE as a gate input and switches a page buffer 10 and even/odd bit lines BLe/BLo. An NMOS transistor M2 receives an even bit line sensing signal BSLe as a gate input and is connected to the even bit line BLe. An NMOS transistor M3 receives an odd bit line sensing signal BSLo as a gate input and is connected to the odd bit line BLo. An NMOS transistor M4 receives an even bit line discharge signal DISe as a gate input and switches a virtual power line VIRPWR and the even bit line BLe. An NMOS transistor M5 receives an odd bit line discharge signal DISo as a gate input and switches the virtual power line VIRPWR and the odd bit line BLo. An NMOS transistor M6 is a switch which switches a source line SL and a core voltage (VCORE) generator 12, and an NMOS transistor M7 is a switch which switches the virtual power line VIRPWR and the core voltage (VCORE) generator 12. For reference, a capacitor Ccoup connected between the even bit line BLe and the odd bit line BLo designates coupling capacitance of the even bit line BLe and the odd bit line BLo.

The figure shows a situation in which the even bit line BLe is selected in a virtual negative read operation represents a switching state of an evaluation period. In this period, the NMOS transistors M1, M4 and M3 are turned off, and the NMOS transistors M6 and M7 are turned on.

Both the even bit line BLe and the odd bit line BLo are connected to the source line SL. Cell current Ic flows through the cell string to which the even bit line BLe is connected, and current Iodd by bouncing flows through the cell string to which the odd bit line BLo is connected. As the NMOS transistors M6 and M7 are turned on, a core voltage VCORE is applied to the source line SL and the virtual power line VIRPWR. As a result, Ic-Iodd-Isw flows through the source line SL, and Ic-Iodd-Isw with an opposite direction flows through the virtual power line VIRPWR (Isw denotes switch current).

FIG. 2 is a view showing changes in the waveforms of the source line SL and the virtual power line VIRPWR while cell current Ic flows.

In order for the switch circuits such as the NMOS transistor M6 and M7 to allow current flow, a condition of Vds>0V (Vds is a drain-source voltage of an NMOS transistor) is required. In the process of setting Vds to allow current flow, noise may be generated in the source line SL and the virtual power line VIRPWR as Vds reaches a target voltage level Vtarg of the core voltage VCORE. Noise patterns are oppositely induced in the source line SL and the virtual power line VIRPWR. In other words, noise is typically generated as an overshoot in the source line SL and as an undershoot in the virtual power line VIRPWR. This may result because the cell current Ic flow in the virtual negative read operation is larger than a current driving force of the switch circuits such as the NMOS transistors M6 and M7.

As described above, the noise of the source line SL and the virtual power line VIRPWR may lead to a distortion of a cell threshold voltage (Vth), thereby deteriorating the characteristics of a device.

SUMMARY

An embodiment of the present invention is directed to a nonvolatile memory device capable of minimizing noise of a core bias line that is generated in a virtual negative read operation.

In accordance with an embodiment of the present invention, A nonvolatile memory device includes: a driving voltage generation unit configured to generate a driving voltage of a core bias line included in a memory cell current path; a comparison unit configured to compare a voltage level of the core bias line with a predetermined limit level in response to a virtual negative read signal; and a compensation driving unit configured to compensation-drive the core bias line in response to an output signal of the comparison unit.

In accordance with another embodiment of the present invention, a nonvolatile memory device includes: a driving voltage generation unit configured to generate a driving voltage of a source line; a comparison unit configured to compare a voltage level of the source line with a predetermined limit level in response to a virtual negative read signal; and a compensation pull-down driving unit configured to compensation pull-down drive the source line in response to an output signal of the comparison unit.

In accordance with another embodiment of the present invention, a nonvolatile memory device includes: a driving voltage generation unit configured to generate a driving voltage of a virtual power line; a comparison unit configured to compare a voltage level of the virtual power line with a predetermined limit level in response to a virtual negative read signal; and a compensation pull-up driving unit configured to compensation pull-up drive the virtual power line in response to an output signal of the comparison unit.

DETAILED DESCRIPTION

Figure 1:
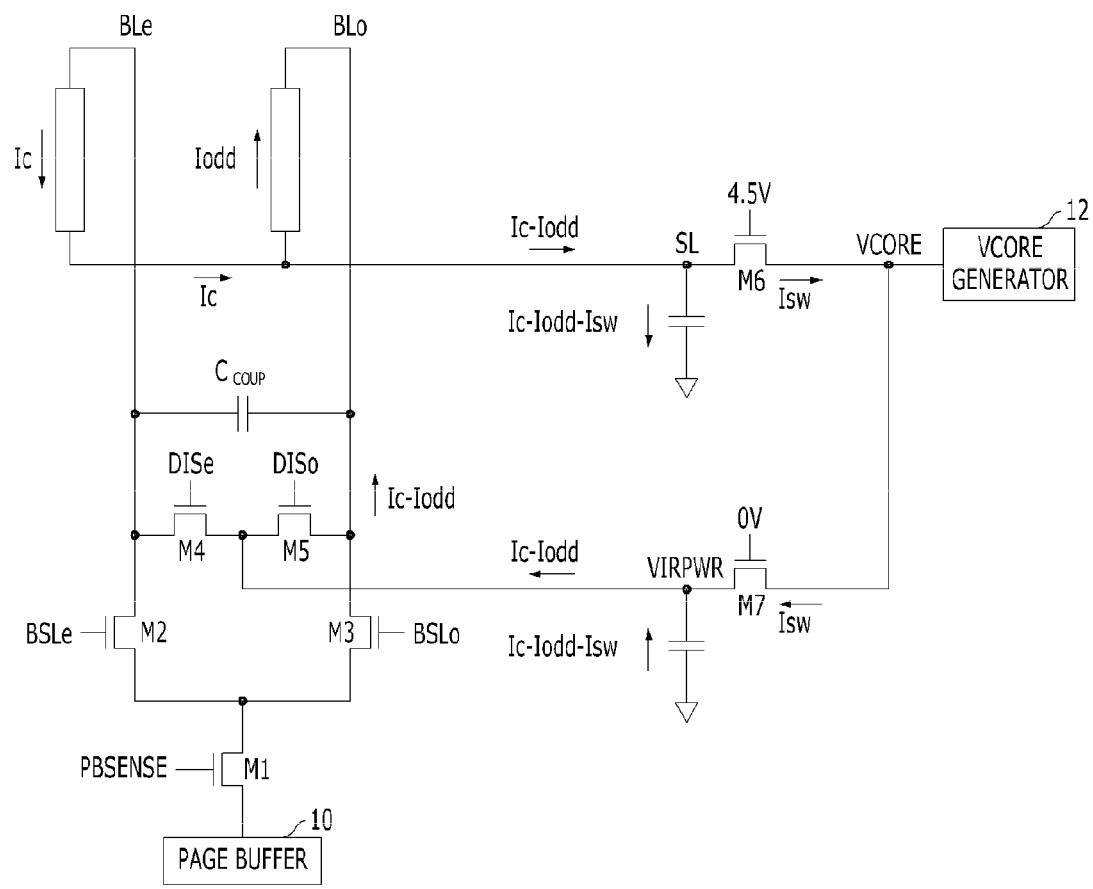
FIG. 1 is a view showing cell current flow in a virtual negative read operation and the configuration of a switch circuit.
Figure 2:
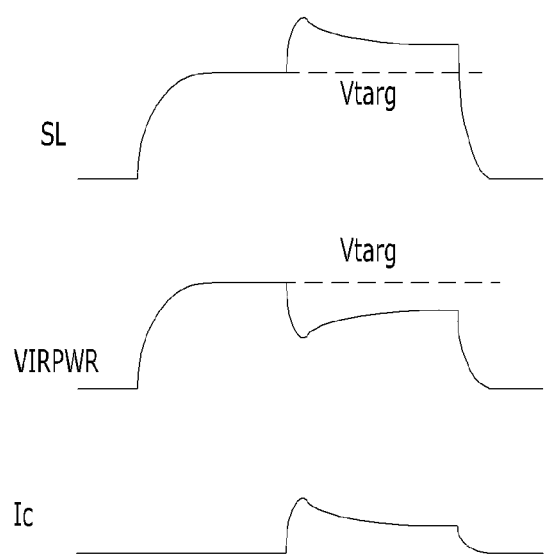
FIG. 2 is a view showing changes in the waveforms of a source line and a virtual power line while cell current flows.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough. Throughout the disclosure, like reference numerals refer to like parts throughout the various figures and embodiments of the present invention.

Figure 3:
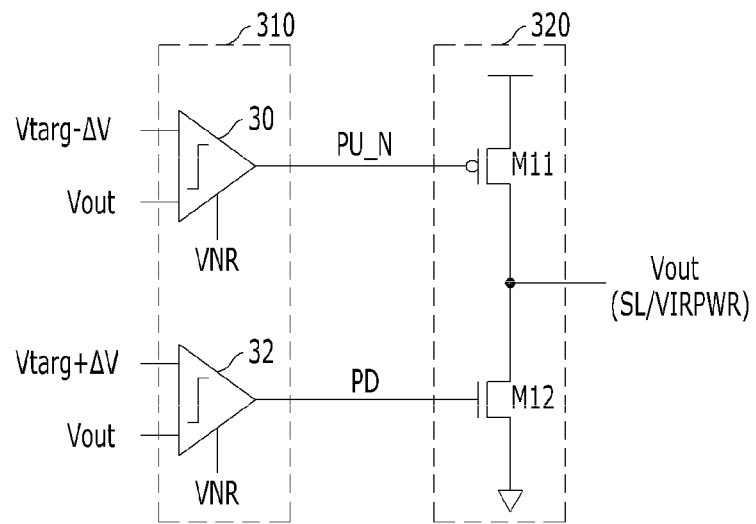
FIG. 3 is a view showing a core bias line stabilization circuit of a nonvolatile memory device in accordance with an embodiment of the present invention.

FIG. 3 is a view showing a core bias line stabilization circuit of a nonvolatile memory device in accordance with an embodiment of the present invention.

As shown in FIG. 1, a core voltage generator may be provided. The core voltage generator may generate a core voltage VCORE as a driving voltage of core bias lines SL and VIRPWR. The core bias line stabilization circuit shown in FIG. 3 is added for compensation driving the source line SL or the virtual power line VIRPWR. As such, the core voltage generator may operate as a driving voltage generation unit.

Referring to FIG. 3, the core bias line stabilization circuit of a nonvolatile memory device in accordance with an embodiment of the present invention includes a comparison unit 310 configured to compare a fed-back voltage level Vout of core bias lines SL/VIRPWR with predetermined limit levels Vtarg±ΔV in response to a virtual negative read signal VNR. The comparison unit 310 may also comprise a compensation driving unit 320 configured to compensation-drive the core bias lines SL/VIRPWR in response to output signals PU_N and PD of the comparison unit 310.

The comparison unit 310 includes a first comparison section 30 configured to compare a first limit level Vtarg−ΔV with the fed-back voltage level Vout in response to the virtual negative read signal VNR. The first limit level Vtarg−ΔV may be lower by a preset level than a target level Vtarg of the core voltage VCORE. The comparison unit 310 may also comprise a second comparison section 32 configured to compare a second limit level Vtarg+ΔV with the fed-back voltage level Vout in response to the virtual negative read signal VNR. The second limit level Vtarg+ΔV may be higher by the preset level than the target level Vtarg of the core voltage VCORE.

The compensation driving unit 320 includes a pull-up driving section configured to pull-up drive the core bias lines SL/VIRPWR in response to the output signal PU_N. The compensation driving unit 320 may also include a pull-down driving section configured to pull-down drive the core bias lines SL/VIRPWR in response to the output signal PD. The pull-up driving section may comprise a PMOS transistor M11 having a source which is connected to a power supply voltage terminal, a drain which is connected to the core bias lines SL/VIRPWR and a gate which is inputted with the output signal PU_N of the first comparison section 30. The pull-down driving section may comprise an NMOS transistor M12 having a source which is connected to a ground voltage terminal, a drain which is connected to the core bias lines SL/VIRPWR and a gate which is inputted with the output signal PD of the second comparison section 32.

Figure 4:
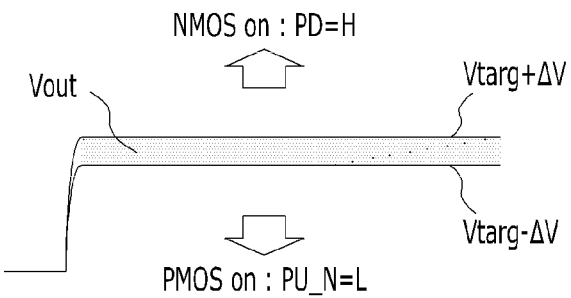
FIG. 4 is a view showing the waveform of an output signal of the core bias line stabilization circuit of a nonvolatile memory device of FIG. 3.

FIG. 4 is a view showing the waveform of an output signal Vout of the core bias line stabilization circuit of a nonvolatile memory device of FIG. 3.

In a virtual negative read operation, the virtual negative read signal VNR is activated, and the comparison unit 310 is enabled.

If the voltage level Vout of the core bias lines SL/VIRPWR is lower than the first limit level Vtarg−ΔV, the output signal PU_N becomes a logic low level. Accordingly, the PMOS transistor M11 is turned on, and pull-up driving is performed until the voltage level Vout of the core bias lines SL/VIRPWR becomes higher than the first limit level Vtarg−ΔV.

If the voltage level Vout of the core bias lines SL/VIRPWR is higher than the second limit level Vtarg+ΔV, the output signal PD becomes a logic high level. Accordingly, the NMOS transistor M12 is turned on, and pull-down driving is performed until the voltage level Vout of the core bias lines SL/VIRPWR becomes lower than the second limit level Vtarg+ΔV.

In the case where the voltage level Vout of the core bias lines SL/VIRPWR is within the limit levels Vtarg±ΔV, pull-up and pull-down operations are not performed.

As a result, even though noise is generated in the source line SL or the virtual power line VIRPWR during the virtual negative read operation, the voltage level Vout of a corresponding line is stabilized within the predetermined limit levels Vtarg±ΔV.

The value of ΔV in the limit levels Vtarg±ΔV may be determined in consideration of the responding speeds of the first and second comparison sections 30 and 32.

Figure 5:
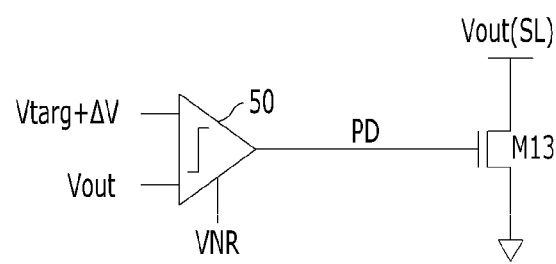
FIG. 5 is a view showing a core bias line stabilization circuit of a nonvolatile memory device in accordance with another embodiment of the present invention.

FIG. 5 is a view showing a core bias line stabilization circuit of a nonvolatile memory device in accordance with another embodiment of the present invention.

Referring to FIG. 5, the core bias line stabilization circuit of a nonvolatile memory device in accordance with an embodiment of the invention includes a comparison unit 50 configured to compare a fed-back voltage level Vout of a source line SL with a predetermined limit level Vtarg+ΔV in response to a virtual negative read signal VNR, and a compensation pull-down driving unit configured to compensation pull-down drive the source line SL in response to an output signal PD of the comparison unit 50.

The compensation pull-down driving unit may comprise an NMOS transistor M13 having a source which is connected to ground voltage terminal, a drain which is connected to the source line SL and a gate which is inputted with the output signal PD.

In a virtual negative read operation, if the virtual negative read signal VNR is activated and the comparison unit 50 is enabled, the comparison unit 50 compares the fed-back voltage level Vout of the source line SL with the predetermined limit level Vtarg+ΔV.

If the voltage level Vout of the source line SL is higher than the limit level Vtarg+ΔV, the output signal PD of the comparison unit 50 becomes a logic high level. Accordingly, the NMOS transistor M13 is turned on, and pull-down driving is performed until the voltage level Vout of the source line SL becomes lower than the predetermined limit level Vtarg+ΔV.

If, on the other hand, the voltage level Vout of the source line SL is lower than the limit level Vtarg+ΔV, a pull-down operation is not performed.

As a result, even though noise may be generated in the source line SL during the virtual negative read operation, the voltage level Vout of the source line SL is stabilized below the predetermined limit level Vtarg+ΔV. Because the noise generated in the source line SL during the virtual negative read operation mainly constitutes an overshoot, most noise may be eliminated by using a pull-down circuit.

The value ΔV of the limit level Vtarg+ΔV may be determined in consideration of the responding speed of the comparison unit 50. In some cases, ΔV may be set to 0V so that a target voltage Vtarg of a core voltage VCORE is used as it is.

Figure 6:
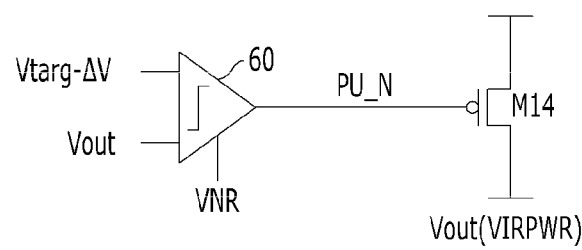
FIG. 6 is a view showing a core bias line stabilization circuit of a nonvolatile memory device in accordance with another embodiment of the present invention.

FIG. 6 is a view showing a core bias line stabilization circuit of a nonvolatile memory device in accordance with another embodiment of the present invention.

Referring to FIG. 6, the core bias line stabilization circuit of a nonvolatile memory device in accordance with an embodiment of the invention includes a comparison unit 60 configured to compare a fed-back voltage level Vout of a virtual power line VIRPWR with a predetermined limit level Vtarg−ΔV in response to a virtual negative read signal VNR. The comparison unit 60 may also comprise a compensation pull-up driving unit configured to compensation pull-up drive the virtual power line VIRPWR in response to an output signal PU_N.

The compensation pull-up driving unit may comprise a PMOS transistor M14 having a source which is connected to power supply voltage terminal, a drain which is connected to the virtual power line VIRPWR and a gate which is inputted with the output signal PU-N.

In a virtual negative read operation, if the virtual negative read signal VNR is activated and the comparison unit 60 is enabled, the comparison unit 60 compares the fed-back voltage level Vout of the virtual power line VIRPWR with the predetermined limit level Vtarg−ΔV.

If the voltage level Vout is lower than the limit level Vtarg−ΔV, the output signal PU_N of the comparison unit 60 becomes a logic low level. Accordingly, the PMOS transistor M14 is turned on, and pull-up driving is performed until the voltage level Vout of the virtual power line VIRPWR becomes higher than the predetermined limit level Vtarg−ΔV.

If, on the other hand, the voltage level Vout of the virtual power line VIRPWR is higher than the limit level Vtarg−ΔV, a pull-up operation is not performed.

As a result, even though noise is generated in the virtual power line VIRPWR during the virtual negative read operation, the voltage level Vout of the virtual power line VIRPWR is stabilized over the predetermined limit level Vtarg−ΔV. Because the noise generated in the virtual power line VIR-PWR during the virtual negative read operation mainly constitutes an undershoot, most noise may be eliminated by using a pull-up circuit.

The value ΔV in the limit level Vtarg+ΔV may be determined in consideration of the responding speed of the comparison unit 60. In some cases, ΔV may be set to 0V so that a target voltage Vtarg of a core voltage VCORE is used as it is.

As is apparent from the above descriptions, noise of a core bias line that is generated in a virtual negative read operation may be minimized, whereby distortion of a cell threshold voltage (Vth) can be prevented.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
a driving voltage generation unit configured to generate a driving voltage of a core bias line included in a memory cell current path;
a comparison unit configured to compare a voltage level of the core bias line with a predetermined limit level in response to a virtual negative read signal; and
a compensation driving unit configured to compensation-drive the core bias line in response to an output signal of the comparison unit,
wherein the virtual negative read signal is activated and the comparison unit is enabled in a virtual negative read operation.

2. The nonvolatile memory device of claim 1, wherein the comparison unit comprises:
a first comparison section configured to compare a first limit level lower by a preset level than a target level of the driving voltage with the voltage level of the core bias line in response to the virtual negative read signal; and
a second comparison section configured to compare a second limit level higher by the preset level than the target level of the driving voltage with the voltage level of the core bias line in response to the virtual negative read signal.

3. The nonvolatile memory device of claim 2, wherein the compensation driving unit comprises:
a pull-up driving section configured to pull-up drive the core bias line in response to an output signal of the first comparison section; and
a pull-down driving section configured to pull-down drive the core bias line in response to an output signal of the second comparison section.

4. The nonvolatile memory device of claim 3, wherein the core bias line is a source line.

5. The nonvolatile memory device of claim 3, wherein the core bias line is a virtual power line.

6. The nonvolatile memory device of claim 3, wherein the pull-up driving section comprises a PMOS transistor having a source which is connected to a power supply voltage terminal, a drain which is connected to the core bias line and a gate which is inputted with the output signal of the first comparison section.

7. The nonvolatile memory device of claim 3, wherein the pull-down driving section comprises an NMOS transistor having a source which is connected to a ground voltage terminal, a drain which is connected to the core bias line and a gate which is inputted with the output signal of the second comparison section.

8. The nonvolatile memory device of claim 1, wherein the virtual negative read operation is performed by applying a ground voltage to a selected word line and a positive bias voltage to the core bias line, respectively.

9. A nonvolatile memory device comprising:
a driving voltage generation unit configured to generate a driving voltage of a source line;
a comparison unit configured to compare a voltage level of the source line with a predetermined limit level in response to a virtual negative read signal; and
a compensation pull-down driving unit configured to compensation pull-down drive the source line in response to an output signal of the comparison unit,
wherein the virtual negative read signal is activated and the comparison unit is enabled in a virtual negative read operation.

10. The nonvolatile memory device of claim 9, wherein the predetermined limit level is a voltage level that is higher by a preset level than a target level of the driving voltage.

11. The nonvolatile memory device of claim 9, wherein the predetermined limit level is a target level of the driving voltage.

12. The nonvolatile memory device of claim 9, wherein the compensation pull-down driving unit comprises an NMOS transistor having a source which is connected to a ground voltage terminal, a source which is connected to the source line and a gate which is inputted with the output signal of the comparison unit.

13. The nonvolatile memory device of claim 9, wherein the virtual negative read operation is performed by applying a ground voltage to a selected word line and a positive bias voltage to the source line, respectively.

14. A nonvolatile memory device comprising:
a driving voltage generation unit configured to generate a driving voltage of a virtual power line;
a comparison unit configured to compare a voltage level of the virtual power line with a predetermined limit level in response to a virtual negative read signal; and
a compensation pull-up driving unit configured to compensation pull-up drive the virtual power line in response to an output signal of the comparison unit,
wherein the virtual negative read signal is activated and the comparison unit is enabled in a virtual negative read operation.

15. The nonvolatile memory device of claim 14, wherein the predetermined limit level is a voltage level that is lower by a preset level than a target level of the driving voltage.

16. The nonvolatile memory device of claim 14, wherein the predetermined limit level is the target level of the driving voltage.

17. The nonvolatile memory device of claim 14, wherein the compensation pull-up driving unit comprises a PMOS transistor having a source which is connected to a power supply voltage terminal, a source which is connected to the virtual power line and a gate which is inputted with the output signal of the comparison unit.

18. The nonvolatile memory device of claim 14, wherein the virtual negative read operation is performed by applying a ground voltage to a selected word line and a positive bias voltage to the virtual power line, respectively.

* * * * *